(12) United States Patent
Hou

(10) Patent No.: US 10,868,090 B2
(45) Date of Patent: Dec. 15, 2020

(54) DISPLAY SUBSTRATE, MANUFACTURE METHOD OF THE SAME, DISPLAY PANEL

(71) Applicant: BOE Technology Group Co., Ltd., Beijing (CN)

(72) Inventor: Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 31 days.

(21) Appl. No.: 16/176,277

(22) Filed: Oct. 31, 2018

(65) Prior Publication Data

US 2019/0189709 A1    Jun. 20, 2019

(30) Foreign Application Priority Data

Dec. 15, 2017 (CN) .......................... 2017 1 1349263

(51) Int. Cl.
| | | |
|---|---|---|
| *H01L 27/15* | (2006.01) | |
| *H01L 27/32* | (2006.01) | |
| *H01L 51/56* | (2006.01) | |
| *H01L 51/00* | (2006.01) | |
| *H01L 51/52* | (2006.01) | |

(52) U.S. Cl.
CPC ...... *H01L 27/3246* (2013.01); *H01L 27/3283* (2013.01); *H01L 51/56* (2013.01); *H01L 51/0005* (2013.01); *H01L 51/5206* (2013.01)

(58) Field of Classification Search
CPC ............... H01L 27/124; H01L 27/3246; H01L 27/3276; H01L 23/564
See application file for complete search history.

(56) References Cited

U.S. PATENT DOCUMENTS

| | | | | |
|---|---|---|---|---|
| 2015/0210048 | A1* | 7/2015 | Jeong | B32B 43/006 428/212 |
| 2015/0243676 | A1* | 8/2015 | Jung | H01L 51/5243 257/72 |
| 2015/0280169 | A1* | 10/2015 | Choi | H01L 51/5237 257/72 |
| 2016/0111688 | A1* | 4/2016 | Lee | H01L 51/56 257/40 |
| 2017/0294501 | A1* | 10/2017 | Jang | H01L 27/3246 |
| 2019/0221620 | A1* | 7/2019 | Li | H01L 27/3244 |

* cited by examiner

*Primary Examiner* — Phuc T Dang
(74) *Attorney, Agent, or Firm* — Westman, Champlin & Koehler, P.A.

(57) ABSTRACT

A display substrate, a manufacture method of a display substrate, and a display panel is provided. The display substrate includes a display region, and a non-display region extending from at least one edge of the display region, wherein the display region includes a display pixel definition layer, the non-display region includes a non-display pixel definition layer, and an adhesive property of the display pixel definition layer to a first pixel material layer in the display pixel definition layer is higher than that of the non-display pixel definition layer to a second pixel material layer in the non-display pixel definition layer.

19 Claims, 5 Drawing Sheets

DISPLAY SUBSTRATE, MANUFACTURE METHOD OF THE SAME, DISPLAY PANEL

CROSS-REFERENCE TO RELATED APPLICATION

The present application claims a priority of a Chinese patent application No. 201711349263.3 filed in China on Dec. 15, 2017, the disclosure of which is incorporated herein in its entirety by reference.

TECHNICAL FIELD

The present disclosure relates to a field of display technology, and particularly, to a display substrate, a method for manufacturing a display substrate, and a display panel.

BACKGROUND

With continuous development of display technology, more and more types of display devices are generated. Organic Light-Emitting Diode (OLED) display devices draw specific interests of people due to advantages thereof such as self-luminescence, fast response speed, wide view angles, high brightness, vivid colors, light weight and thin thickness.

In order to promote a rate of utilizing materials for manufacturing the OLED display devices and a yield of manufactured OLED display devices, processes for manufacturing the OLED display devices are developed constantly.

SUMMARY

The present disclosure provides a display substrate, a method for manufacturing a display substrate, and a display panel.

In a first aspect, the present disclosure provides a display substrate. The display substrate includes a display region, and a non-display region extending from at least one edge of the display region, wherein the display region includes a display pixel definition layer, the non-display region includes a non-display pixel definition layer, and an adhesive property of the display pixel definition layer to a first pixel material layer in the display pixel definition layer is higher than that of the non-display pixel definition layer to a second pixel material layer in the non-display pixel definition layer.

Optionally, the first pixel material layer in the display pixel definition layer and the second pixel material layer in the non-display pixel definition layer are formed of same structures.

Optionally, a bonding force of a material of the non-display pixel definition layer to the second pixel material layer in the non-display pixel definition layer is higher than that of a material of the display pixel definition layer to the first pixel material layer in the display pixel definition layer.

Optionally, a specific surface area of a material of the non-display pixel definition layer is higher than that of a material of the display pixel definition layer.

Optionally, the non-display pixel definition layer includes a porous structure, a surface of the porous structure includes a plurality of absorption pores, and each of the plurality of absorption pores has a diameter between 1 nm to 50 nm.

Optionally, the porous structure includes a fundamental material layer and a porous material layer covering a surface of the fundamental material layer.

Optionally, an entirety of the non-display pixel definition layer is the porous structure.

Optionally, the porous structure is formed of a porous material, and a specific surface area of the porous material is between 100 $m^2/g$ and 2000 $m^2/g$.

Optionally, the display pixel definition layer includes a hydrophobic structure, and a surface of the hydrophobic structure includes a hydrophobic material layer.

Optionally, the hydrophobic structure includes a fundamental material layer and a hydrophobic material layer covering a surface of the fundamental material layer.

Optionally, an entirety of the display pixel definition layer is the hydrophobic structure, and the hydrophobic structure is formed of a hydrophobic material.

Optionally, a material of the non-display pixel definition layer includes one or more of polysulfone, polyvinylpyridine, polyester compounds, and activated charcoal; and a material of the display pixel definition layer includes one or more of fluorinated polyimide, fluorinated polymethyl methacrylate, polyorganosiloxan, and organic siliconresin.

Optionally, the display pixel definition layer forms a plurality of display pixel isolation wall patterns, the non-display pixel definition layer forms a plurality of non-display pixel isolation wall patterns; and ones of the plurality of display pixel isolation wall patterns at the at least one edge of the display region facing towards the non-display region correspond to ones of the plurality of non-display pixel isolation wall patterns adjacent to the ones of the plurality of display pixel isolation wall patterns in a one-to-one manner.

Optionally, each of the plurality display pixel isolation wall patterns contacts with one of the plurality of non-display pixel isolation wall patterns corresponding to the display pixel isolation wall pattern.

Optionally, the ones of the plurality of display pixel isolation wall patterns at the at least one edge of the display region facing towards the non-display region, and the plurality of non-display isolation wall patterns have vertical side surfaces, each of the vertical side surfaces forms a 90-degree angle with the base substrate, and the vertical side surfaces of each of the ones of the display pixel isolation wall patterns and the vertical side surface of the non-display pixel isolation pattern corresponding to the display pixel isolation wall patterns contact with each other.

In a second aspect, the present disclosure provides a display panel. The display panel includes the display substrate according to the first aspect, wherein the display pixel definition layer forms a plurality of display pixel isolation wall patterns, each of the plurality of display pixel isolation wall patterns includes a display pixel unit; the non-display pixel definition layer forms a plurality of non-display pixel isolation wall patterns, each of the non-display pixel isolation wall patterns includes a non-display pixel unit, and each of the display pixel unit and the non-display pixel unit includes pixel material.

Optionally, the display panel is a self-luminescent display panel, the pixel material is ink including a self-luminescent material.

In a third aspect, the present disclosure provides a method for manufacturing a display substrate. The method includes forming a non-display pixel definition layer on a base substrate as a non-display region; and forming a display pixel definition layer on the base substrate as a display region, wherein an adhesive property of the display pixel definition layer to a first pixel material layer in the display pixel definition layer is higher than that of the non-display pixel definition layer to a second pixel material layer in the non-display pixel definition layer.

Optionally, forming the non-display pixel definition layer includes: forming a first material layer in the non-display region using a material of the non-display pixel definition layer, and patterning the first material layer to form the plurality of non-display pixel isolation wall patterns. Forming the display pixel definition layer includes: forming a second material layer in the display region using a material of the display pixel definition layer, patterning the second material layer to form the plurality of display pixel isolation wall patterns.

Optionally, before forming the non-display pixel definition layer on the base substrate as the non-display region, the method further includes: forming a plurality of anode patterns in the display region on the base substrate, wherein an amount of the plurality of anode patterns is same as a quantity of pixel material layers formed in the display region, and the plurality of anode patterns correspond to the pixel material layers in a one-to-one manner.

BRIEF DESCRIPTION OF THE DRAWINGS

Drawings of the present disclosure are used to enhance understanding of the present disclosure and form a part of the present disclosure. Schematic embodiments and description of the embodiments are used to explain the present disclosure, and do not limit the scope of the present disclosure.

DETAILED DESCRIPTION

A display substrate, a method for manufacturing the display substrate, a display panel provided in some embodiments of the present disclosure are described in details hereinafter in combination with the description and the drawings.

The display substrate, the method for manufacturing a display substrate, and the display panel provided in the present disclosure may address a problem that a uniformity of a thin film formed by an inkjet printing process is poor, not by arranging more non-display pixel definition layers and pixel material layers.

Figure 1:
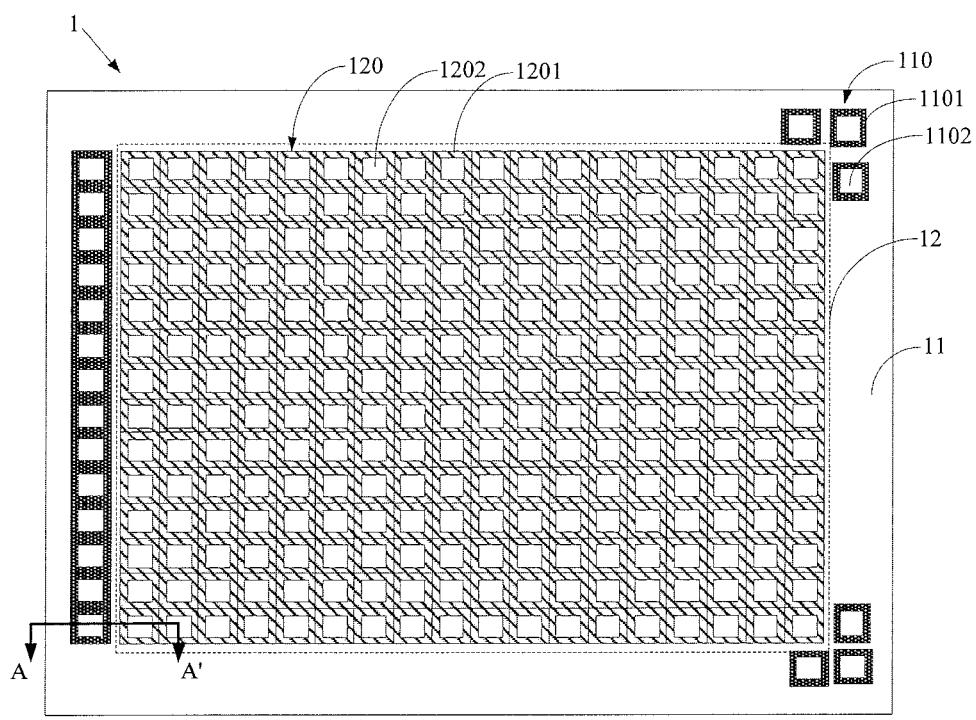
FIG. 1 is a structural schematic diagram of a display substrate according to some embodiments of the present disclosure.
Figure 2:
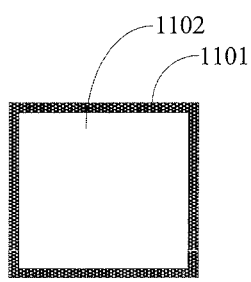
FIG. 2 is a schematic diagram of a non-display pixel isolation wall pattern according to some embodiments of the present disclosure.
Figure 3:
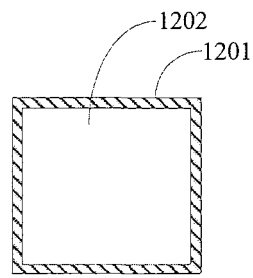
FIG. 3 is a schematic diagram of a display pixel isolation wall pattern according to some embodiments of the present disclosure.

Referring to FIGS. 1-3, some embodiments of the present disclosure provide a display substrate. The display substrate includes a display region 12 and a non-display region 11 extending from at least one edge of the display region 12. The display region 12 includes a display pixel definition layer 120. The non-display region 11 includes a non-display pixel definition layer 110. An adhesive property of the non-display pixel definition layer 110 is higher than that of the display pixel definition layer 120.

Specifically, the display region 12 of the display substrate 1 includes the display pixel definition layer 120. The display pixel definition layer 120 may define a plurality of first areas. The plurality of first areas is configured to form a plurality of display pixel units 1202 used for displaying images. The non-display region 11 of the display substrate 1 includes the non-display pixel definition layer 110. The non-display pixel definition layer 110 may define a plurality of second areas. The plurality of second areas is configured to form a plurality of non-display pixel units 1102 not used for displaying images.

When using the display substrate 1 to manufacture a display panel, a first pixel material layer is formed in the plurality of first areas defined by the display pixel definition layer 120 using a solvent for forming the first pixel material layer by an inkjet printing technology, and a second pixel material layer is formed in the plurality of second areas defined by the non-display pixel definition layer 110 using a solvent for forming the second pixel material layer by the inkjet printing technology. Because the adhesive property of the non-display pixel definition layer 110 is higher than that of the display pixel definition layer 120, an adhesive action of the non-display pixel definition layer 110 to the solvent for forming the second pixel material layer in the plurality of second areas is larger than that of the display pixel definition layer 120 to the solvent for forming the first pixel material layer in the plurality of first areas. In this way, in a desiccation process, a volatilization speed of the solvent for forming the second pixel material layer in the plurality of second areas is slowed, thereby reducing a difference between the volatilization speed of the solvent for forming the second pixel material layer in the plurality of second areas and a volatilization speed of the solvent for forming the first pixel material layer in the plurality of first areas.

According to a specific structure of the display substrate and a specific process of forming a display panel using the display substrate, in the display substrate provided according to some embodiments of the present disclosure, the adhesive property of the non-display pixel definition layer 110 in the non-display region 11 is higher than that of the display pixel definition layer 120 in the display region 12. In this way, when forming the second pixel material layer in the non-display pixel definition layer 110 and the first pixel material layer in the display pixel definition layer 120, the volatilization speed of the solvent for forming the second pixel material layer in the non-display pixel definition layer 110 (i.e., the plurality of second areas) is slower so that the difference between the volatilization speed of the solvent for forming the second pixel material layer in the non-display pixel definition layer 110 and the volatilization speed of the solvent for forming the first pixel material layer in the display pixel definition layer 120 (i.e., the plurality of first areas) is reduced. Thus, the problem that the uniformity of the thin film formed by the inkjet printing process is poor may be addressed by forming fewer non-display pixel definition layers and pixel material layers. The display substrate provided in some embodiments of the present disclosure may not only make layers formed on the display substrate 1 have a better uniformity, but also meet a development requirement of a narrow bezel of the display substrate 1.

It should be noted that the adhesive property of the display pixel definition layer 120 includes the adhesive property of the display pixel definition layer 120 to the first pixel material layer in the display pixel definition layer 120, and the adhesive property of the non-display pixel definition layer 110 includes the adhesive property of the non-display pixel definition layer 110 to the second pixel material layer in the non-display definition layer 110. Thus, the adhesive property of the non-display pixel definition layer 110 being higher than that of the display pixel definition layer 120 means that the adhesive property of the non-display pixel definition layer 110 to the second pixel material layer in the non-display pixel definition layer 110 is higher than that of the display pixel definition layer 120 to the first pixel material layer in the display pixel definition layer 120.

Furthermore, the first pixel material layer in the display pixel definition layer 120 and the second pixel material layer in the non-display pixel definition layer 110 are formed of same structures. Specifically, each of the first and second pixel material layers may include a light-emission layer, a hole transport layer, a hole injection layer and the like. The first pixel material layer in the display pixel definition layer 120 is used for display, but the second pixel material layer in the non-display pixel definition layer 110 is not used for display.

Further, a bonding force of a material of the non-display pixel definition layer 110 to the second pixel material layer in the non-display pixel definition layer 110 is larger than that of a material of the display pixel definition layer 120 to the first pixel material layer in the display pixel definition layer 120; and/or, a specific surface area of the material of the non-display pixel definition layer 110 is higher than that of the material of the display pixel definition layer 120.

When the bonding force of the material of the non-display pixel definition layer 110 to the second pixel material layer in the non-display pixel definition layer 110, the bonding force between the non-display pixel definition layer 110 and the second pixel material layer in the non-display pixel definition layer 110 is large, so that the solvent for forming the second pixel material layer is more difficult to volatilize in the desiccation process. Thus, a desiccation speed of the second pixel material layer in the non-display pixel definition layer 110 may be effectively slowed. Thus, by configuring the bonding force of the material of the non-display pixel definition layer 110 to the second pixel material layer in the non-display pixel definition layer 110 to be higher than that of the material of the display pixel definition layer 120 to the first pixel material layer in the display pixel definition layer 120, the difference between the desiccation speed of the solvent for forming the second pixel material layer in the non-display pixel definition layer 110 and the desiccation speed of the solvent for forming the first pixel material layer in the display pixel definition layer 120 is reduced. Thus, the problem that the uniformity of the thin film formed by the inkjet printing process is poor may be addressed by forming fewer non-display pixel definition layer and pixel material layers.

Similarly, by configuring the specific surface area of the material of the non-display pixel definition layer 110 to be higher than that of the material of the display pixel definition layer 120, the difference between the desiccation speed of the solvent for forming the second pixel material layer in the non-display pixel definition layer 110 and the desiccation speed of the solvent for forming the first pixel material layer in the display pixel definition layer 120 is reduced. Thus, the uniformity of the layers on the display substrate and a uniformity of display brightness of the display substrate may be ensured by forming fewer non-display pixel definition layer 110 and pixel material layers.

A structure of the non-display pixel definition layer 110 may be diverse. Optionally, the non-display pixel definition layer 110 includes a porous structure. A surface of the porous structure includes a plurality of absorption pores. Each of the plurality of absorption pores has a diameter between 1 nm to 50 nm.

By configuring the non-display pixel definition layer 110 to include the porous structure, the plurality of absorption pores having diameters between 1 nm to 50 nm included in the surface of the porous structure may absorb the solvent for forming the second pixel material layer when forming the second pixel material layer in the non-display pixel definition layer 110, thereby effectively controlling the volatilization speed of the solvent for forming the second pixel material layer printed in the non-display pixel definition layer 110, and reducing the difference between the desiccation speed of the solvent for forming the second pixel material layer in the non-display pixel definition layer 110 and the desiccation speed of the solvent for forming the first pixel material layer in the display pixel definition layer 120. Thus, the uniformity of the layers on the display substrate and a uniformity of display brightness of the display substrate may be ensured by forming fewer non-display pixel definition layer and pixel material layers.

Figure 7:
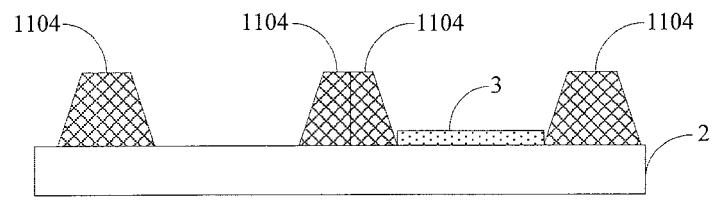
FIG. 7 is a schematic diagram of a fundamental material layer manufactured by a method for manufacturing a display substrate according to some embodiments of the present disclosure.
Figure 8:
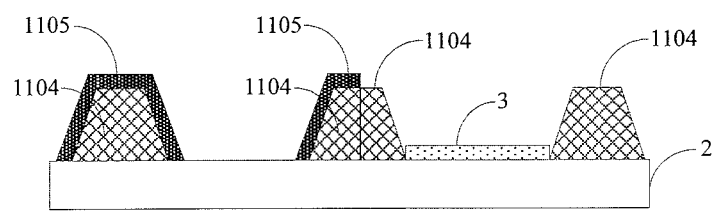
FIG. 8 is a schematic diagram of a porous material layer manufactured by a method for manufacturing a display substrate according to some embodiments of the present disclosure.

Further, the porous structure may specifically include a fundamental material layer 1104 and a porous material layer 1105 covering a surface of the fundamental material layer 1104, as shown in FIG. 8. It should be noted that FIGS. 4-9 are cross-sectional views taken along a line A-A' in FIG. 1.

When manufacturing the porous structure, fundamental material may be coated on a base substrate 2, and then the coated fundamental material is patterned by exposing and developing processes to form the fundamental material layer 1104, as shown in FIG. 7. Thereafter, porous material is coated in the non-display region 11, and then the coated porous material is patterned by exposing and developing processes to form the porous material layer 1105 covering the surface of the fundamental material layer 1104, as shown in FIG. 8.

It should be noted that the fundamental material may be common photoresist for forming a pixel definition layer in the related art. The fundamental material may have no hydrophobic capability or adhesive capability.

Figure 5:
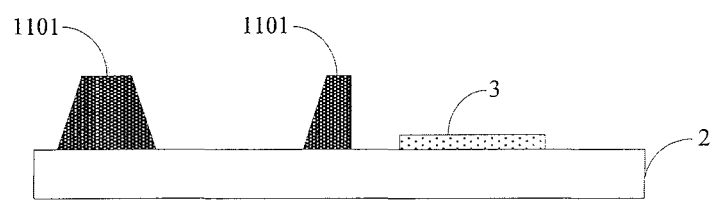
FIG. 5 is a schematic diagram of a non-display pixel isolation wall pattern manufactured by a method for manufacturing a display substrate according to some embodiments of the present disclosure.

Optionally, an entirety of the non-display pixel definition layer 110 may be a porous structure, as shown in FIG. 5. In this way, when forming the non-display pixel definition layer 110, the porous material may be coated onto an array substrate directly, and the coated porous material may be patterned by exposing and developing processes to forming the non-display pixel definition layer 110 having the porous structure.

Types of porous materials that may be used above are various. Optionally, porous materials having a specific surface area between 100 m²/g and 2000 m²/g are used. A surface of the porous structure formed of the porous materials may have more absorption pores, so that the non-display pixel definition layer 110 including such porous structure has excellent adhesive capability.

The display pixel definition layer 120 includes a hydrophobic structure, and a surface of the hydrophobic structure includes a hydrophobic material layer.

By configuring the display pixel definition layer 120 to include the hydrophobic structure, the hydrophobic material layer included in the surface of the hydrophobic structure may generate a hydrophobic action to the solvent for forming the first pixel material layer, so as to expedite the volatilization speed of the solvent for forming the pixel material layer printed in the display pixel definition layer 120, thereby further reducing the difference between the desiccation speed of the second pixel material layer in the non-display pixel definition layer 120 and the desiccation speed of the first pixel material layer in the display pixel definition layer 120. Therefore, together with the uniformity of the layers on the display substrate and the uniformity of display brightness of the display substrate being ensured, an amount of non-display pixel definition layer and pixel material layers needing to be formed is further reduced.

Figure 9:
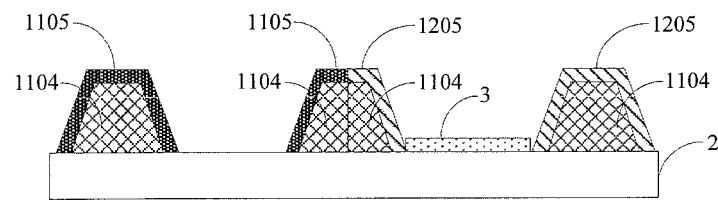
FIG. 9 is a schematic diagram of a hydrophobic material layer manufactured by a method for manufacturing a display substrate according to some embodiments of the present disclosure.
Figure 10:
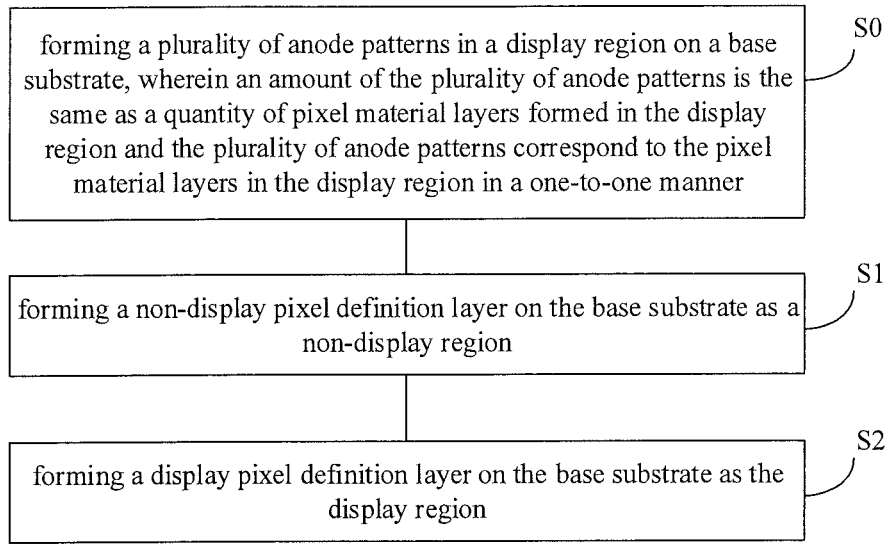
FIGS. 10-13 are flowcharts of a method for manufacturing a display substrate according to some embodiments of the present disclosure.
Figure 11:
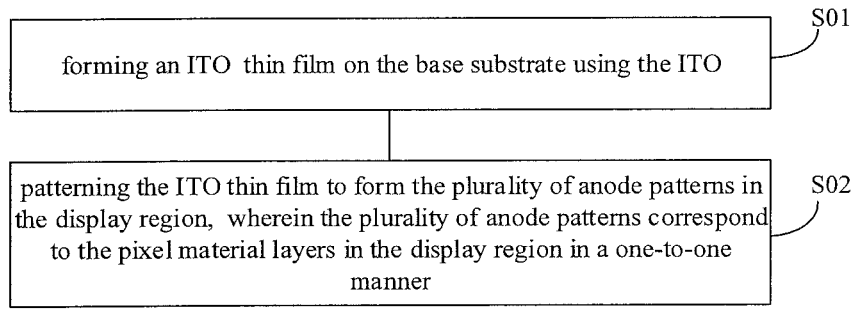
Figure 12:
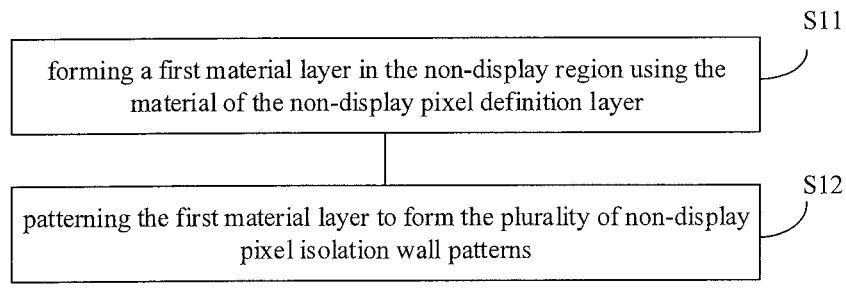
Figure 13:
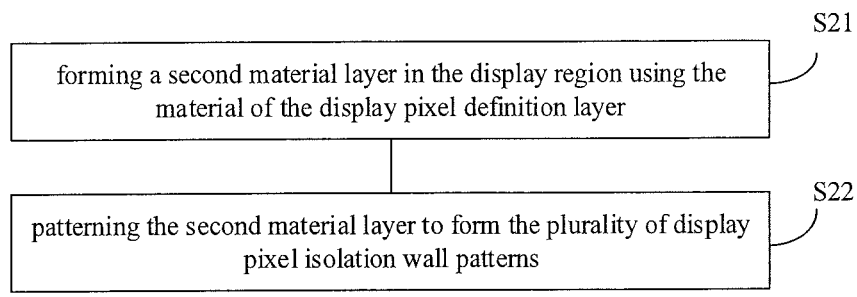

Further, the hydrophobic structure may include the fundamental material layer 1104 and a hydrophobic material layer 1205 covering a surface of the fundamental material layer 1104, as shown in FIG. 9.

When manufacturing the hydrophobic structure, the fundamental material may be coated on the base substrate 2, and then the coated fundamental material is patterned by exposing and developing processes to form the fundamental material layer 1104. Then, the hydrophobic material is coated in the display region 12, and the coated hydrophobic material is patterned by exposing and developing processes to form the hydrophobic material layer 1205 covering the surface of the fundamental material layer 1104.

It should be noted that the material for forming the fundamental material layer in the hydrophobic structure may be the same as the material for forming the fundamental material layer in the porous structure. In this way, the fundamental material layer 1104 included in the hydrophobic structure and the fundamental material layer 1104 included in the porous structure may be formed concurrently in one patterning process, as shown in FIG. 7, and thus a process for manufacturing the display substrate 1 may be simplified.

Figure 6:
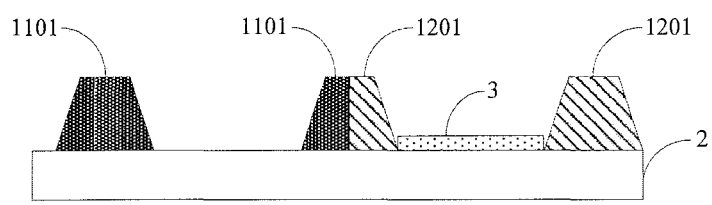
FIG. 6 is a schematic diagram of a display pixel isolation wall pattern manufactured by a method for manufacturing a display substrate according to some embodiments of the present disclosure.

Optionally, an entirety of the display pixel definition layer 120 may be a hydrophobic structure formed of the hydrophobic materials, as shown in FIG. 6.

In this way, when forming the display pixel definition layer 120, the hydrohobic material may be coated onto the array substrate directly, and the coated hydrophobic material may be patterned by exposing and developing processes to forming the display pixel definition layer 120 having the hydrophobic structure.

It should be noted that materials for forming the non-display pixel definition layer 110 may include one or more of: polysulfone, polyvinylpyridine, polyester compounds, and activated charcoal. Materials for forming the display pixel definition layer 120 may include photoresists having a hydrophobic capability, specifically may include one or more of: fluorinated polyimide, fluorinated polymethyl methacrylate, polyorganosiloxan, and organic siliconresin, but the present disclosure is not limited thereto.

As shown in FIGS. 1-3, the display pixel definition layer 120 forms a plurality of display pixel isolation wall patterns 1201, the non-display pixel definition layer 110 forms a plurality of non-display pixel isolation wall patterns 1101. Display pixel isolation wall patterns of the plurality of display pixel isolation wall patterns 1201 in the display pixel definition layer 120 at the at least one edge of the display region 12 facing towards (i.e., adjacent to) the non-display region 11 correspond to non-display pixel isolation wall patterns of the plurality of non-display pixel isolation wall patterns 1101 in plurality of non-display pixel definition layer 110 adjacent to the display pixel isolation wall patterns, in a one-to-one manner.

Because the display pixel isolation wall patterns of the plurality of display pixel isolation wall patterns 1201 at the at least one edge of the display region 12 facing towards (i.e., adjacent to) the non-display region 11 correspond to the non-display pixel isolation wall patterns of the plurality of non-display pixel isolation wall patterns 1101 adjacent to the display pixel isolation wall patterns, in the one-to-one manner, the difference between the desiccation speed of the second pixel material layer in the non-display pixel definition layer 110 and the desiccation speed of the first pixel material layer in the display pixel definition layer 120 is further reduced. Thus, the uniformity of the layers on the display substrate and the uniformity of display brightness of the display substrate may be ensured.

Optionally, each of the display pixel isolation wall patterns 1201 at the at least one edge of the display region 12 facing towards non-display region 11 may be configured to directly contact with the non-display pixel isolation wall pattern 1101 corresponding to the display pixel isolation wall pattern 1101, so that there is no gap between the display pixel isolation wall pattern 1210 at the at least one edge of the display region 12 facing towards non-display region 11, and the non-display pixel isolation wall pattern 1101 corresponding to the display pixel isolation wall pattern 1101.

Specifically, each of the display pixel isolation wall patterns 1201 at the at least one edge of the display region 12 facing towards the non-display region 11 and the plurality of non-display pixel isolation wall patterns 1101 may be configured to have vertical side surfaces perpendicular to the base substrate 2 of the display substrate 1, i.e., be configured to form a 90-degree angle with the base substrate 1, and the vertical side surfaces of the display pixel isolation wall pattern 1201 and the non-display pixel isolation wall pattern 1101 corresponding to the display pixel isolation wall pattern 1201 contact with each other, so that there is no gap between each of the display pixel isolation wall patterns 1201 at the at least one edge of the display region 12 facing towards the non-display region 11 and the non-display pixel isolation wall pattern 1101 corresponding to the display pixel isolation wall paternal 1201. This structure further facilitates implementation of a narrow bezel of the display substrate.

Some embodiments of the present disclosure also provide a display panel including the display substrate 1. The display pixel definition layer 120 forms the plurality of display pixel isolation wall patterns 1201. Each of the plurality of display pixel isolation wall patterns 1201 includes a display pixel unit 1202 used for display. The non-display pixel definition layer 110 forms the plurality of non-display pixel isolation wall patterns 1101. Each of the non-display pixel isolation wall patterns 1101 includes a non-display pixel unit 1102 not used for display. Both the display pixel units 1202 and the non-display pixel units 1102 include pixel materials.

Specifically, when forming the display panel by using the display substrate 1, the display pixel units 1202 used for display are formed in the plurality of display pixel isolation wall patterns 1201 in the display pixel definition layer 120, and the non-display pixel units 1102 not used for display are formed in the plurality of non-display pixel isolation wall patterns 1101 in the non-display pixel definition layer 110. The display pixel units 1202 and the non-display pixel units 1102 include same pixel materials and may be formed in the display pixel definition layer 120 and the non-display pixel definition layer 110 concurrently by using a printing process.

In the display substrate included in the display panel, the adhesive property of the non-display pixel definition layer 110 in the non-display region 11 is higher than that of the display pixel definition layer 120 in the display region 12. In this way, when forming the second pixel material layer in the non-display pixel definition layer 110 and the first pixel material layer in the display pixel definition layer 120, the volatilization speed of the solvent for forming the second pixel material layer in the non-display pixel definition layer 110 is slower so that the difference between the volatilization speed of the solvent for forming the second pixel material layer in the non-display pixel definition layer 110 and the volatilization speed of the solvent for forming the first pixel material layer in the display pixel definition layer 120 is reduced. Thus, the problem that the uniformity of the thin film formed by the inkjet printing process is poor may be addressed by forming fewer non-display pixel definition layer and pixel material layers. Therefore, the display panel including the display substrate provided in some embodiments of the present disclosure may not only make layers formed on the display substrate 1 have a better uniformity, but also meet a development requirement of a narrow bezel of the display substrate 1.

Specifically, the display panel may be a self-luminescent display panel, such as an OLED display panel, a QLED display, or a micro LED display panel. The pixel material formed in the display pixel definition layer 120 and the non-display pixel definition layer 110 includes an ink having self-luminescent material.

Some embodiments of the present disclosure also provide a method for manufacturing a display substrate. The method includes steps S1 and S2.

Step S1: forming the non-display pixel definition layer 110 on the base substrate 2 as the non-display region 11.

Step S2: forming the display pixel definition layer 120 on the base substrate 2 as the display region 12.

An adhesive property of the non-display pixel definition layer 110 is higher than that of the display pixel definition layer 120.

Specifically, the non-display pixel definition layer 110 is formed in the non-display region 11 on the base substrate 2 using the material of the non-display pixel definition layer 110, the display pixel definition layer 120 is formed in the display region 12 on the base substrate 2 using the material of the display pixel definition layer 120, wherein the adhesive property of the material of the non-display pixel definition layer 110 is higher than that of the material of the display pixel definition layer 120 so that the adhesive property of the formed non-display definition layer 110 is higher than that of the formed display pixel definition layer 120.

In the display substrate manufactured by using the method for manufacturing the display substrate, the adhesive property of the non-display pixel definition layer 110 is higher than that of the display pixel definition layer 120. Therefore, when forming the pixel material layers in the non-display pixel definition layer 110 and in the display pixel definition layer 120 using the inkjet printing process, the desiccation speed of the second pixel material layer in the non-display pixel definition layer 110 is slower so that the difference between the desiccation speed of the second pixel material layer in the non-display pixel definition layer 110 and the desiccation speed of the first pixel material layer in the display pixel definition layer 120 is reduced. Thus, the problem that the uniformity of the thin film formed by the inkjet printing process is poor may be addressed by forming fewer non-display pixel definition layer and pixel material layers.

The step S1 of forming the non-display pixel definition layer 110 may include specifically sub-steps S11 and S12.

S11: forming a first material layer in the non-display region 11 using the material of the non-display pixel definition layer 110.

S12: patterning the first material layer to form the plurality of non-display pixel isolation wall patterns 1101.

Specifically, the first material layer is formed in the non-display region 11 on the base substrate 2 using the material of the non-display pixel definition layer 110, the first material layer is patterned by exposing and developing processes to form the plurality of non-display pixel isolation wall patterns 1101 in the non-display region 11.

The step S2 of forming the display pixel definition layer 120 may include specifically sub-steps S21 and S22.

S21: forming a second material layer in the display region 12 using the material of the display pixel definition layer 120.

S22: patterning the second material layer to form the plurality of display pixel isolation wall patterns 1201.

Specifically, the second material layer is formed in the display region 12 on the base substrate 2 using the material of the display pixel definition layer 120, the second material layer is patterned by exposing and developing processes to form the plurality of display pixel isolation wall patterns 1201 in the display region 12.

The method for manufacturing a display substrate further includes a step S0.

Figure 4:
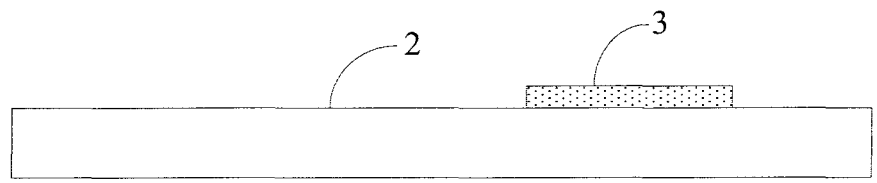
FIG. 4 is a schematic diagram of an anode pattern manufactured by a method for manufacturing a display substrate according to some embodiments of the present disclosure.

S0: forming a plurality of anode patterns 3 in the display region 12 on the base substrate 2 before forming the display pixel definition layer 120 and the non-display pixel definition layer 110, wherein an amount of the plurality of anode patterns is the same as a quantity of pixel material layers formed in the display region 12 and the plurality of anode patterns correspond to the pixel material layers in the display region 12 in a one-to-one manner, as shown in FIG. 4.

The step S0 of forming the plurality of anode patterns 3 includes specifically sub-steps S01-S02.

S01: forming an indium tin oxide (ITO) thin film on the base substrate 2 using the ITO.

S02: patterning the ITO thin film to form the plurality of anode patterns 3 in the display region 12, wherein the plurality of anode patterns correspond to the pixel material layers in the display region 12 in a one-to-one manner.

In the technical solutions of the present disclosure, the adhesive property of the non-display pixel definition layer in the non-display region is higher than that of the display pixel definition layer in the display region. In this way, when forming the second pixel material layer in the non-display pixel definition layer and the first pixel material layer in the display pixel definition layer, the volatilization speed of the solvent for forming the second pixel material layer in the non-display pixel definition layer is slower so that the difference between the volatilization speed of the solvent for forming the second pixel material layer in the non-display pixel definition layer and the volatilization speed of the solvent for forming the first pixel material layer in the display pixel definition layer is reduced. Thus, the problem that the uniformity of the thin film formed by the inkjet printing process is poor may be addressed by forming fewer non-display pixel definition layer and pixel material layers.

Therefore, the technical solutions provided in the present disclosure may not only make film layers formed on the display substrate have a better uniformity, but also meet a development requirement of a narrow bezel of a display substrate.

The embodiments of the present disclosure are described in a progressive manner. Same or similar portions among the embodiments may be derived from each other, and emphases in each of the embodiments are placed on difference of the embodiment from other embodiments.

Specifically, process embodiments are not described in details because the embodiments are basically similar to product embodiments. Similarity between the process embodiments and the product embodiments is described in the product embodiments.

Unless defined otherwise, technical terms or scientific terms used herein should have common meanings understood by those of ordinary skilled in the art to which the present disclosure belongs.

Words such as "first", "second" and the like used in the present disclosure do not represent any order, number or importance, but are used to differentiate different components.

Words such as "including", "includes", "comprising", "comprises" mean that elements or articles preceding the words incorporate elements or articles behind the words and equivalent elements or articles, but do not exclude other elements or articles.

Such words as "connecting", "connected" or the like are not restricted to physical or mechanical connections, but can include electrical connections, whether they are direct or in-direct.

Such words as "upper", "lower", "left", "right" and the like are only used to represent relative positional relations. When an absolute relation of a described object is changed, a relative positional relation thereof is also changed accordingly.

It may be understood that, when an element such as "film", "layer", "region" or "substrate" are described as "below" or "above" another element, the element may be "directly under" or "directly below" the another element, or there may be an intervening element.

In the above description, specific features, structures, materials or features may be combined in any one or more embodiments or examples in any suitable manner.

The above description is only specific embodiments of the present disclosure. However, the protection scope of the present disclosure is not limited thereto. Any variations or replacements anticipated by those skilled in the art in the technical scope disclosed by the present disclosure will fall into the protection scope of the present disclosure.

Thus, the protection scope of the present disclosure should be determined by the claims.

What is claimed is:

1. A display substrate, comprising:
   a display region comprising a display pixel definition layer on a base substrate; and
   a non-display region comprising a non-display pixel definition layer on the base substrate,
   wherein the non-display region extends from at least one edge of the display region,
   an adhesive property of the display pixel definition layer to a first pixel material layer in the display pixel definition layer is higher than that of the non-display pixel definition layer to a second pixel material layer in the non-display pixel definition layer,
   a specific surface area of a material of the non-display pixel definition layer is higher than that of a material of the display pixel definition layer.

2. The display substrate according to claim 1, wherein the first pixel material layer in the display pixel definition layer and the second pixel material layer in the non-display pixel definition layer are formed of same structures.

3. The display substrate according to claim 1, wherein a bonding force of a material of the non-display pixel definition layer to the second pixel material layer in the non-display pixel definition layer is higher than that of a material of the display pixel definition layer to the first pixel material layer in the display pixel definition layer.

4. The display substrate according to claim 1, wherein the non-display pixel definition layer comprises a porous structure, a surface of the porous structure comprises a plurality of absorption pores, and each of the plurality of absorption pores has a diameter between 1 nm to 50 nm.

5. The display substrate according to claim 4, wherein the porous structure comprises a fundamental material layer and a porous material layer covering a surface of the fundamental material layer.

6. The display substrate according to claim 4, wherein an entirety of the non-display pixel definition layer is the porous structure.

7. The display substrate according to claim 4, wherein the porous structure is formed of a porous material, and a specific surface area of the porous material is between 100 $m^2/g$ and 2000 $m^2/g$.

8. The display substrate according to claim 1, wherein, the display pixel definition layer comprises a hydrophobic structure, and a surface of the hydrophobic structure comprises a hydrophobic material layer.

9. The display substrate according to claim 8, wherein the hydrophobic structure comprises a fundamental material layer and a hydrophobic material layer covering a surface of the fundamental material layer.

10. The display substrate according to claim 8, wherein, an entirety of the display pixel definition layer is the hydrophobic structure, and the hydrophobic structure is formed of a hydrophobic material.

11. The display substrate according to claim 1, wherein a material of the non-display pixel definition layer comprises one or more of polysulfone, polyvinylpyridine, polyester compounds, and activated charcoal; and
   a material of the display pixel definition layer comprises one or more of fluorinated polyimide, fluorinated polymethyl methacrylate, polyorganosiloxan, and organic siliconresin.

12. The display substrate according to claim 1, wherein the display pixel definition layer forms a plurality of display pixel isolation wall patterns, the non-display pixel definition layer forms a plurality of non-display pixel isolation wall patterns; and
   ones of the plurality of display pixel isolation wall patterns at the at least one edge of the display region facing towards the non-display region correspond to ones of the plurality of non-display pixel isolation wall patterns adjacent to the ones of the plurality of display pixel isolation wall patterns in a one-to-one manner.

13. The display substrate according to claim 12, wherein, each of the plurality display pixel isolation wall patterns contacts with one of the plurality of non-display pixel isolation wall patterns corresponding to the display pixel isolation wall pattern.

14. The display substrate according to claim 13, wherein the ones of the plurality of display pixel isolation wall patterns at the at least one edge of the display region facing towards the non-display region, and the plurality of non-display isolation wall patterns have vertical side surfaces, each of the vertical side surfaces forms a 90-degree angle with the base substrate, and the vertical side surfaces of each of the ones of the display pixel isolation wall patterns and the vertical side surface of the non-display pixel isolation pattern corresponding to the display pixel isolation wall patterns contact with each other.

15. A display panel, comprising:
the display substrate according to claim 1,
wherein the display pixel definition layer forms a plurality of display pixel isolation wall patterns, each of the plurality of display pixel isolation wall patterns comprises a display pixel unit; the non-display pixel definition layer forms a plurality of non-display pixel isolation wall patterns, each of the non-display pixel isolation wall patterns comprises a non-display pixel unit, and each of the display pixel unit and the non-display pixel unit comprises pixel material.

16. The display panel according to claim 15, wherein the display panel is a self-luminescent display panel, the pixel material is ink comprising a self-luminescent material.

17. A method for manufacturing a display substrate, comprising:
forming a non-display region comprising a non-display pixel definition layer on a base substrate; and
forming a display region comprising a display pixel definition layer on the base substrate,
wherein the non-display region extends from at least one edge of the display region,
an adhesive property of the display pixel definition layer to a first pixel material layer in the display pixel definition layer is higher than that of the non-display pixel definition layer to a second pixel material layer in the non-display pixel definition layer,
a specific surface area of a material of the non-display pixel definition layer is higher than that of a material of the display pixel definition layer.

18. The method according to claim 17, wherein, forming the non-display region comprising the non-display pixel definition layer on the base substrate, comprises:
forming a first material layer in the non-display region using a material of the non-display pixel definition layer, and patterning the first material layer to form the plurality of non-display pixel isolation wall patterns;
forming the display region comprising the display pixel definition layer on the base substrate comprises:
forming a second material layer in the display region using a material of the display pixel definition layer, patterning the second material layer to form the plurality of display pixel isolation wall patterns.

19. The method according to claim 17, wherein, before forming the non-display region comprising the non-display pixel definition layer on the base substrate, the method further comprises:
forming a plurality of anode patterns in the display region on the base substrate, wherein an amount of the plurality of anode patterns is same as a quantity of pixel material layers formed in the display region, and the plurality of anode patterns correspond to the pixel material layers in a one-to-one manner.

* * * * *